United States Patent
Nam et al.

(10) Patent No.: US 7,638,856 B2
(45) Date of Patent: Dec. 29, 2009

(54) OPTOELECTRONIC TRANSMITTER INTEGRATED CIRCUIT AND METHOD OF FABRICATING THE SAME USING SELECTIVE GROWTH PROCESS

(75) Inventors: Eun Soo Nam, Daejeon (KR); Yong Won Kim, Daejeon (KR); Seon Eui Hong, Daejeon (KR); Myung Sook Oh, Daejeon (KR); Bo Woo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 113 days.

(21) Appl. No.: 11/872,137

(22) Filed: Oct. 15, 2007

(65) Prior Publication Data

US 2008/0029759 A1 Feb. 7, 2008

Related U.S. Application Data

(62) Division of application No. 11/282,339, filed on Nov. 18, 2005, now Pat. No. 7,297,976.

(30) Foreign Application Priority Data

Nov. 22, 2004 (KR) ...................... 10-2004-0095949

(51) Int. Cl.
*H01L 29/00* (2006.01)
(52) U.S. Cl. ...................... 257/552; 257/553; 257/557; 257/561; 257/E29.033
(58) Field of Classification Search .......... 257/552–562
See application file for complete search history.

(56) References Cited

U.S. PATENT DOCUMENTS 6,222,951 B1 * 4/2001 Huang .......................... 385/14
6,229,189 B1 * 5/2001 Yap et al. ..................... 257/414

* cited by examiner

*Primary Examiner*—Wai-Sing Louie
(74) *Attorney, Agent, or Firm*—Ladas & Parry LLP

(57) ABSTRACT

Provided are an optoelectronic (OE) transmitter integrated circuit (IC) and method of fabricating the same using a selective growth process. In the OE transmitter IC, a driving circuit, which includes a double heterojunction bipolar transistor (DHBT) and amplifies received electric signals to drive an electroabsorption (EA) modulator, and the EA modulator with a multi-quantum well (MQW) absorption layer are integrated as a single chip on a semi-insulating substrate. The MQW absorption layer of the EA modulator and an MQW insertion layer of the DHBT are formed to different thicknesses from each other using a selective MOCVD growth process.

3 Claims, 4 Drawing Sheets

OPTOELECTRONIC TRANSMITTER INTEGRATED CIRCUIT AND METHOD OF FABRICATING THE SAME USING SELECTIVE GROWTH PROCESS

CROSS-REFERENCE TO RELATED APPLICATION

This application claims priority to and the benefit of Korean Patent Application No. 2004-95949, filed Nov. 22, 2004, the disclosure of which is incorporated herein by reference in its entirety.

BACKGROUND

1. Field of the Invention

The present invention relates to an optoelectronic transmitter integrated circuit and method of fabricating the same and, more specifically, to an optoelectronic transmitter integrated circuit having an integrated single chip structure in which an absorption layer of an electroabsorption (EA) modulator and a quantum well (QW) layer of a double heterojunction bipolar transistor (DHBT) have different thicknesses, and method of fabricating the same using a selective MOCVD (Metal Organic Chemical Vapor Deposition) growth method.

2. Discussion of Related Art

A conventional long-wavelength optical transmitter integrated circuit in which a semiconductor laser and a DHBT are integrated is widely used in optical communication systems. In general, such an optical transmitter integrated circuit is fabricated by growing the semiconductor laser structure on a substrate and then growing the DHBT structure on the substrate on which the semiconductor laser is grown.

In the conventional optical transmitter integrated circuit in which the semiconductor laser is integrated, when a driving current is supplied to an active layer to drive the semiconductor laser, the refractive index of the active layer is changed so that oscillation wavelength fluctuates (this is generally termed "chirping") and thus, modulation speed is limited. For this reason, the conventional optical transmitter integrated circuit cannot be readily utilized for high-speed and long-distance optical communications.

In another case, the conventional optical transmitter integrated circuit may include an electroabsorption (EA) modulator in place of a semiconductor laser. In this case, when a reverse bias voltage is applied to a quantum well absorption layer, a quantum confined stark effect (QCSE) occurs so that the absorption band wavelength of light is changed. That is, because no chirping takes place unlike in the semiconductor laser, the optical transmitter integrated circuit in which the EA modulator is integrated can be used for high-capacity long-distance optical communications. However, since a conventional pin type EA modulator has the same epitaxial crystal structure as a DHBT consisting of $p^+$-base, i-collector and $n^+$-sub collector, it cannot have an independent epitaxial structure and optimize its characteristics. Thus, it is difficult to further improve the modulation efficiency and driving characteristic of the optical transmitter integrated circuit (IC).

SUMMARY OF THE INVENTION

The present invention is directed to an optoelectronic (OE) transmitter integrated circuit (IC) and method of fabricating the same, in which a multi-quantum well (MQW) absorption layer of an electroabsorption (EA) modulator is formed to a thicker thickness using a selective MOCVD growth process so as to enhance the coupling and modulation efficiency of the EA modulator. Also, the EA modulator is integrated as a single chip on a semi-insulating substrate along with a driving circuit fabricated using the DHBT, which amplifies small electric signals to the high gained large electrical signal, so that the fabrication of the OE transmitter integrated circuit is simple.

One aspect of the present invention is to provide an OE transmitter integrated circuit including: a semi-insulating substrate; an EA modulator disposed in a first region on the semi-insulating substrate and having a first sub-collector layer, a first clad layer, an MQW absorption layer, and a second clad layer; and a DHBT disposed in a second region adjacent to the first region on the semi-insulating substrate and having a second sub-collector layer, a collector layer, an MQW insertion layer, a base layer, an emitter layer, and an ohmic layer, wherein the MQW insertion has a smaller thickness than that of the MQW absorption layer.

The EA modulator may further include a first electrode disposed on a predetermined region of the second layer; and a second electrode disposed on a predetermined region of the first sub-collector layer.

The DHBT may further include an emitter electrode disposed on a predetermined region of the ohmic layer and having a mesa structure; a base electrode disposed on a predetermined region of the base layer; and a collector electrode disposed on a predetermined regions of the second sub-collector layer.

Another aspect of the present invention is provide a method of fabricating an OE transmitter integrated circuit including steps of: forming a sub-collector layer and a first semiconductor layer on a semi-insulating substrate; forming insulating patterns on the first semiconductor layer, the insulating patterns required for performing a selective metal organic chemical vapor deposition (MOCVD) process; forming a relatively thick MQW absorption layer in a first region of the exposed first semiconductor layer between the insulating patterns, and forming a relatively thin MQW insertion layer in a second region of the exposed first semiconductor layer outside the first region, by selectively growing an MQW active layer in the first and second regions; removing the insulating patterns and forming a second semiconductor layer, a third semiconductor layer, and an ohmic layer on the exposed semi-insulating substrate; isolating the first region from the second region; forming a DHBT in the second region, the DHBT having the sub-collector layer, a collector layer formed of the first semiconductor layer, the MQW insertion layer, a base layer formed of the second semiconductor layer, an emitter layer formed of the third semiconductor layer, and the ohmic layer, which are sequentially stacked; and forming an EA modulator in the first region, the EA modulator including the sub-collector layer, a first clad layer formed of the first semiconductor layer, the MQW absorption layer, and a second clad layer formed of the second semiconductor layer.

The step of forming the DHBT may include steps of: forming a mesa type emitter by selectively etching the ohmic layer and the emitter layer in the second region, and forming an emitter electrode on the ohmic layer; forming a base electrode on a predetermined region of the base layer; and selectively removing top portions of the base layer, the insertion layer, the collector layer, and the sub-collector layer outside the base electrode and forming a collector electrode on a predetermined region of the exposed sub-collector layer.

The step of forming the EA modulator may include steps of: removing the ohmic layer and the third semiconductor layer from the first region; defining a waveguide type EA modulator by removing top portions of the second clad layer, the MQW absorption layer, the first clad layer, and the sub-collector layer from the first region; and forming a second electrode on a predetermined region of the second clad layer and forming a first electrode on a predetermined region of the exposed sub-collector layer.

In order to have thicker crystal thickness the gap distance between the insulating patterns for forming the MQW absorption layer in the first region may be smaller than a distance between the insulating patterns for forming the MQW insertion layer in the second region, if any.

The MQW active layer may be formed of MQW i-InGaAs—InP and formed by growing on the first semiconductor layer formed of InP using a selective MOCVD process.

The step of isolating the first region from the second region may include a step of; removing the ohmic layer, the third semiconductor layer, the second semiconductor layer, the MQW active layer, the first semiconductor layer, the sub-collector layer, and a predetermined portion of the semi-insulating substrate between the first and second regions.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Figure 1:
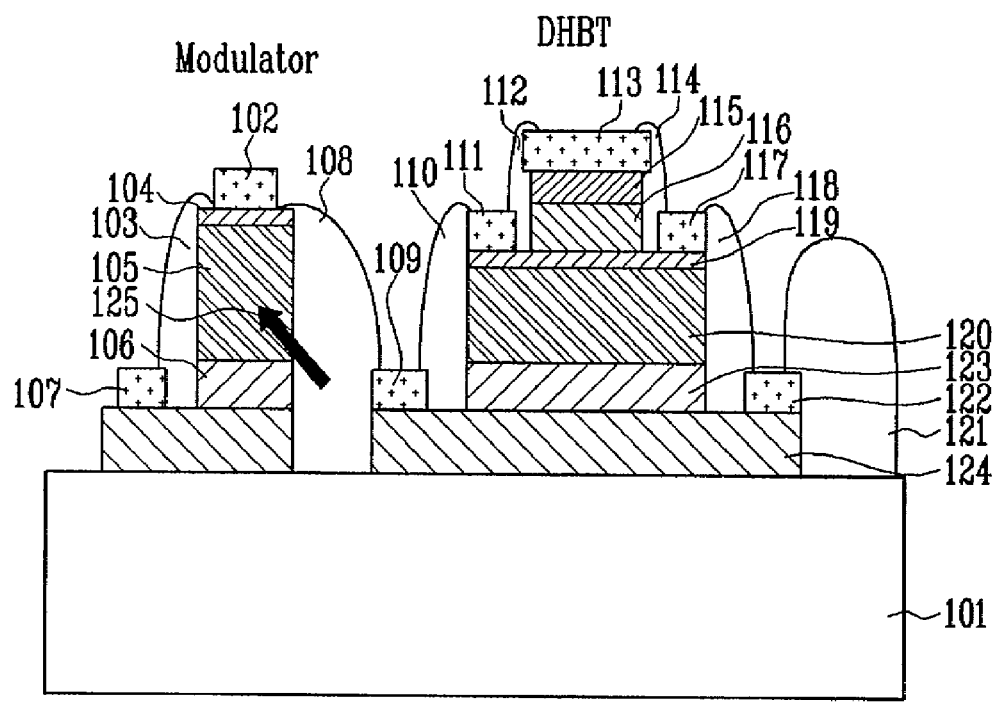
FIG. 1 is a cross sectional view of an optoelectronic (OE) transmitter integrated circuit according to an exemplary embodiment of the present invention.

The present invention will now be described more fully hereinafter with reference to the accompanying drawings, in which exemplary embodiments of the invention are shown. In the embodiments of the present invention, an electroabsorption (EA) modulator formed of n-InP/multi-quantum well (MQW) i-InGaAs—InP/p$^+$InGaAs and a double heterojunction bipolar transistor (DHBT) formed of n-InP/MQW i-InGaAs—InP/p$^+$InGaAs/n-InP, which are formed on a semi-insulating InP substrate, are exemplarily described. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers may be exaggerated for clarity, and the same reference numerals are used to denote the same elements throughout the drawings.

FIG. 1 is a cross sectional view of an optoelectronic (OE) transmitter integrated circuit (IC) according to an exemplary embodiment of the present invention.

Referring to FIG. 1, the OE transmitter integrated circuit includes an EA modulator and a DHBT, which are formed adjacent to each other on a semi-insulating InP substrate 101. The DHBT is disposed in a driving circuit that drives the EA modulator. More specifically, the OE transmitter integrated circuit is structured in a single chip such that the thickness of an absorption layer of the EA modulator is greater than that of an insertion layer of the DHBT, which facilitates the transport of charges.

More specifically, the extinction characteristic of the EA modulator mostly depends on the structure of an MQW region that is an active region. Basically, the EA modulator has a p-i-n diode structure. An intermediate layer refers to an intrinsic region and includes the MQW structure. Since an electric field is mostly applied to the intrinsic region, in the case of a typical electrode, the thicker thickness of the intrinsic region plays an important role in reducing the capacitance of the EA modulator that determines the maximum speed limit. The EA modulator is based on the principle that the absorption coefficient of a material varies with an externally applied electric field owing to a quantum confined stark effect (QCSE). Accordingly, it is important to appropriately control the composition, thickness, and strain of a quantum well barrier such that the amount of absorption is as increased as possible at a desired driving voltage.

Therefore, the EA modulator according to the present invention has the p-i-n structure, which is comprised of a p$^+$InGaAs layer 104, an MQW i-InP/InGaAs quantum well absorption layer 105, and an n-InP layer 106. Here, the quantum well absorption layer 105 is formed using a selective MOCVD growth process to a greater thickness than that of a quantum well insertion layer of the DHBT disposed in the modulator driving circuit. Also, the p$^+$InGaAs layer 104 is connected to a p-electrode 102, whereas the n-InP layer 106 is connected to an n-electrode 107 by a sub-collector layer 124. Further, the resultant structure is covered by polymers 103 and 108 for the purpose of surface protection and electrical connection; but the p-electrode 102 and the n-electrode 107 are partially exposed.

Typically, the foregoing DHBT includes a quantum well layer interposed between a base layer and a collector layer (hereinafter, a "QW insertion layer" or "insertion layer"). The quantum well insertion layer has an intermediate bandgap between the bandgaps of the base layer and the collector layer in order to alleviate a phenomenon that a potential barrier caused by a bandgap difference between the base layer and the collector layer prevents current from passing through the transistor. Thus, because the quantum well insertion layer with an intermediate bandgap makes the flow of current smooth between the base layer and the collector layer, the DHBT including the quantum well insertion layer can improve the efficiency of collector current and employ a high breakdown voltage of InP collector.

Accordingly, the DHBT according to the present invention has an n-p-n structure, which is comprised of an n-InP collector layer 123, an MQW i-InGaAs/InP quantum well insertion layer 120, a p$^+$InGaAs base layer 119, and an n-InP emitter layer 116, which are disposed over the semi-insulating InP substrate 101. Here, the quantum well insertion layer 120 is formed using a selective MOCVD growth process to a smaller thickness than that of the quantum well absorption layer 105 of the EA modulator. Also, the n-InP collector layer 123 is connected to collector electrodes 109 and 122 by the n$^+$InP sub-collector layer 124, the p$^+$InGaAs base layer 119 is connected to base electrodes 111 and 117, and the n-InP emitter layer 116 is connected to an emitter electrode 113 by an n$^+$InGaAs ohmic layer 115. In addition, for the purpose of surface protection and electrical connection, the n-InP collector layer 123, the MQW i-InGaAs/InP quantum well insertion layer 120, and the p$^+$InGaAs base layer 119 are covered by polymers 110 and 118, the n-InP emitter layer 116 and the n$^+$InGaAs ohmic layer 115 are covered by polymers 112 and 114, and the n⁺InP sub-collector layer 124 is covered by the polymer 108 and a polymer 121. In this case, the DEBT is formed adjacent to the EA modulator on the same semi-insulating InP substrate 101.

As described above, in the present invention, the DHBT formed of n-InP/p⁺InGaAs/MQW InP—InGaAs/n-InP is integrated as a single chip with the waveguide type EA modulator, which includes the thick quantum well photo absorption layer obtained by the selective growth process, on the same semi-insulating substrate. In this structure, the OE transmitter integrated circuit chip can be used for high-speed optical communications and obtain high modulation efficiency and a stable driving characteristic.

Figure 2:
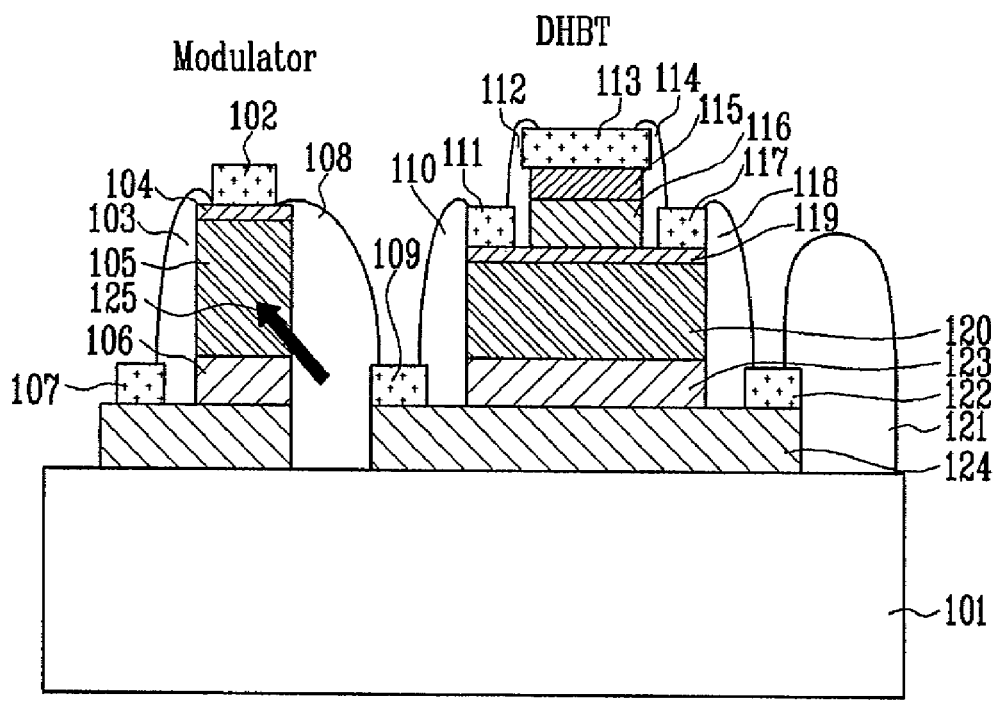
FIGS. 2 thru 2B are cross sectional views of a substrate before and after a selective MOCVD growth process is performed, respectively.
Figure 2A:
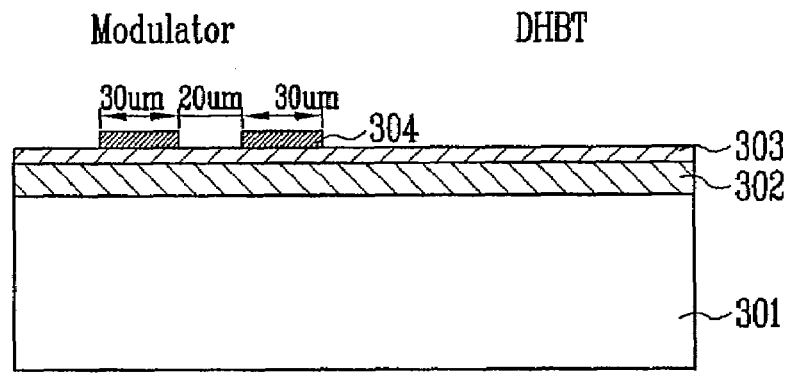
Figure 2B:
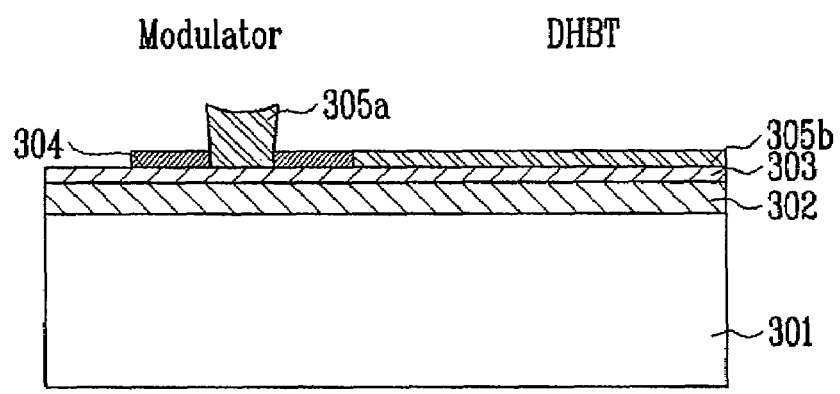
Figure 3:
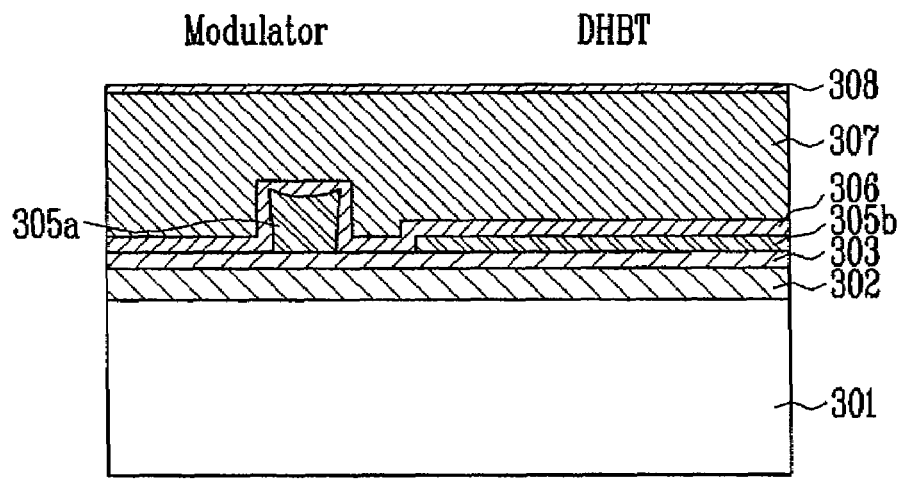
FIG. 3 is a cross sectional view of a substrate on which a selective growth process and a final growth process are performed.

FIGS. 2A and 2B are cross sectional views of a substrate before and after a selective growth process is performed, and FIG. 3 is a cross sectional view of a substrate on which the selective growth process and a final growth process are performed.

At the outset, insulating masking patterns 304 as shown in FIG. 2A are used in order to grow crystalline layers having enhanced thicknesses on the surface of a semi-insulating InP substrate 301. Referring to FIG. 2A, an n⁺InP sub-collector layer 302, an n-InP layer 303, and two insulating patterns 304 are formed on the substrate 301. The insulating patterns 304, for example, each have a width of 30 μm and are spaced 20 μm apart from each other. Specifically, when the IInGaAs—InP QW layers are grown on the i-InP layer 303 of the semi-insulating InP substrate 301 on which the insulating patterns 304 are formed for a selective metal organic chemical vapor deposition (MOCVD) process, a QW crystalline layer is grown between the two insulating patterns 304 and another QW crystalline layer is grown outside a region between the insulating patterns 304. The two crystalline layers have quantum well structures with different thicknesses of well and barrier and bandgap energies according to the layer width and gap space of the insulating patterns 304. As a crystalline layer is grown to a greater thickness, a larger amount of light is absorbed into the cross section of the crystalline layer and coupled with the crystalline layer. As a result, the light coupling and modulation efficiency is improved.

In other words, as shown FIG. 2B, by use of a selective MOCVD growth process, an absorption layer 305a for an EA modulator and an insertion layer 305b for a DHBT are formed to respectively different thicknesses according to the width and gap of dielectric masks (i.e., the insulating patterns 304). Thus, the DHBT, which is formed of n-InP/p⁺InGaAs/MQW InP—InGaAs/n-InP, can have optimized characteristics, while the absorption layer 305a of the waveguide type EA modulator becomes thicker enough to enhance the light coupling and modulation efficiency. For instance, as each of the dielectric masks has a greater width, more number of element atoms move from the dielectric masks toward the surface of the grown layer. Thus, the thickness of the grown QW layer becomes thicker and the bandgap energy of its quantum well structure becomes lower. Therefore, while the absorption layer 305a of the EA modulator and the insertion layer 305b of the DEBT are being formed using a single epitaxial growth process, the absorption layer 305a can be grown to a thicker thickness than that of the insertion layer 305b. As a result, a larger amount of light couples to the absorption layer 305a of the modulator at certain modulated wavelength band, thus enhancing the modulation efficiency.

For example, as shown in FIG. 3, additional semiconductor layers 306, 307, and 308 may be formed on the selectively grown quantum well layers having different thicknesses, and then the EA modulator and the DHBT may be fabricated. In this case of the MQW layers which act as the absorption layer 305a of the waveguide type EA modulator that operate in a certain wavelength of 1.55 μm, MQW insertion layer 305b of the DHBT is grown to have an intermediate bandgap (about 0.9 eV in the wavelength of 1.45 μm) between the bandgaps of a base and a collector using the selective MOCVD growth process. Thus, the DHBT in which the flow of current is not blocked between the base and the collector can be integrated in a single chip using a single epitaxial growth process. In this regard, according to the present invention, when the absorption layer 305a of the waveguide type EA modulator is designed, the width of the insulating patterns 304 as masks can be optimized so that the EA modulator can obtain high modulation efficiency at the desired light wavelength.

Hereinafter, a method of fabricating the above-described OE transmitter integrated circuit using a selective MOCVD growth process will be described with reference to FIGS. 2A through 4F.

FIGS. 4A through 4F are cross sectional views illustrating a method of an OE transmitter integrated circuit according to an exemplary embodiment of the present invention.

At the outset, as shown in FIG. 2A, an n⁺InP layer 302 and an n⁻InP layer 303 are sequentially grown on a semi-insulating InP substrate 301. Thereafter, insulating patterns 304 formed of an insulating material are formed on the n⁻InP layer 303, and a selective MOCVD process is carried out using the insulating patterns 304 so that an absorption layer 305a for a waveguide type EA modulator and an insertion layer 305b for a DHBT are grown at the same time. Here, the insertion layer 305b makes the flow of current between the base layer and collector layer smooth in the DHBT.

In this fabrication process, as shown in FIG. 2B, the absorption layer 305a for the waveguide type EA modulator is grown between the insulating patterns 304 formed to a greater thickness than that of the insertion layer 305b, which facilitates the flow of current between the base layer and collector layer in the DHBT. For example, when the insulating patterns 304 are each formed to a patterned layer width of about 30 μm and are spaced about 20 μm apart from each other, the absorption layer 305a formed of MQW InP/InGaAs, which is grown between the insulating patterns 304, is formed to a relatively thicker thickness, whereas the insertion layer 305b of the DHBT, which is grown outside a region between the insulating patterns 304, is formed to a relatively thinner thickness.

Therefore, according to the present invention, the OE transmitter integrated circuit with high modulation efficiency and a stable driving circuit with high breakdown voltage of the DEBT characteristic can be fabricated using a single selective epitaxial MOCVD process.

Thereafter, as shown in FIG. 3, after the absorption layer 305a for the waveguide type EA modulator and the insertion layer 305b for the DHBT are grown, the insulating patterns 304 are removed, and a p⁺InGaAs base layer 306, an n⁺InP emitter layer 307, and an n⁺In0.53Ga0.47As ohmic layer 308 for improving an ohmic characteristic are grown. Thus, a crystalline structure for a single-chip OE transmitter, in which the absorption layer 305a for the EA modulator is grown to a greater thickness than that of the insertion layer 305b for the DHBT on the same wafer plane, is completed.

Figure 4A:
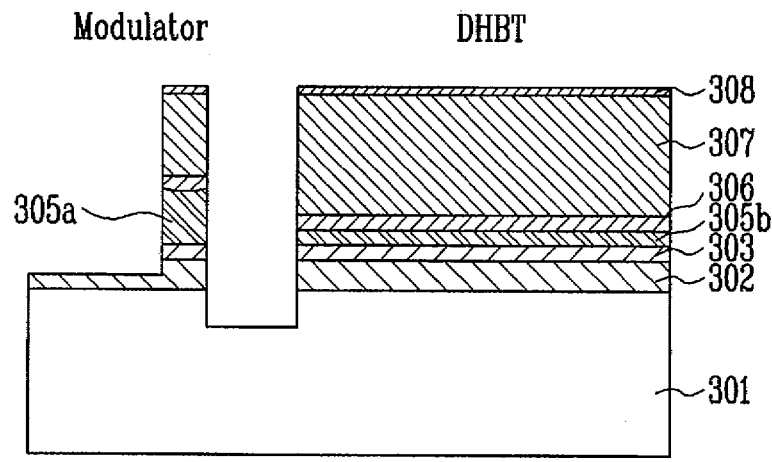
FIGS. 4A through 4F are cross sectional views illustrating a method of fabricating an OE transmitter integrated circuit according to an exemplary embodiment of the present invention.

Once the crystalline wafer structure for the OE transmitter with high modulation efficiency is completed by growing the absorption layer 305a of the waveguide type EA modulator to a greater thickness than that of the insertion layer 305b for the DHBT on the same wafer plane, the DHBT is formed masking the EA modulator part by using an insulating layer (not shown) and an ordinary photolithography process. Referring to FIG. 4A, first of all, the insulating layer is formed and etched using the photolithography process. Thereafter, by using a reactive ion beam etching (RIE) process, the n$^+$In0.53Ga0.47As ohmic layer 308, the n$^+$InP emitter layer 307, the p$^+$InGaAs base layer 306, MQW InGaAs—InP layer 305, the n-InP collector layer 303, the n$^+$InP sub-collector layer 302, and a predetermined portion of the semi-insulating InP substrate 301 between the absorption layer 305a and the insertion layer 305b are etched so that a region for the waveguide EA modulator and a region for the DHBT are isolated from each other.

After the region for the waveguide type EA modulator is masked using the insulating layer and the photolithography process, the DHBT is fabricated.

Figure 4B:
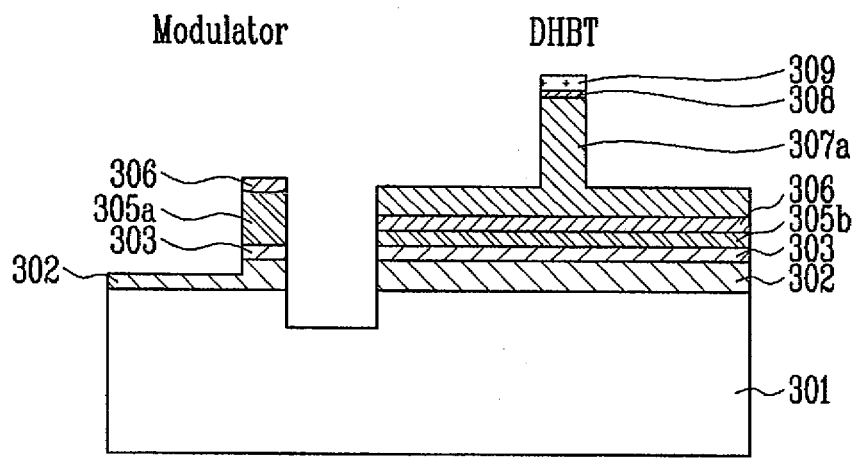

Specifically, as shown in FIG. 4B, the n$^+$In0.53Ga0.47As ohmic layer 308 and the n-InP layer 307 are etched using a selective etching process to form a mesa type emitter 307a, and an emitter electrode 309 is formed on the ohmic layer 308.

Figure 4C:
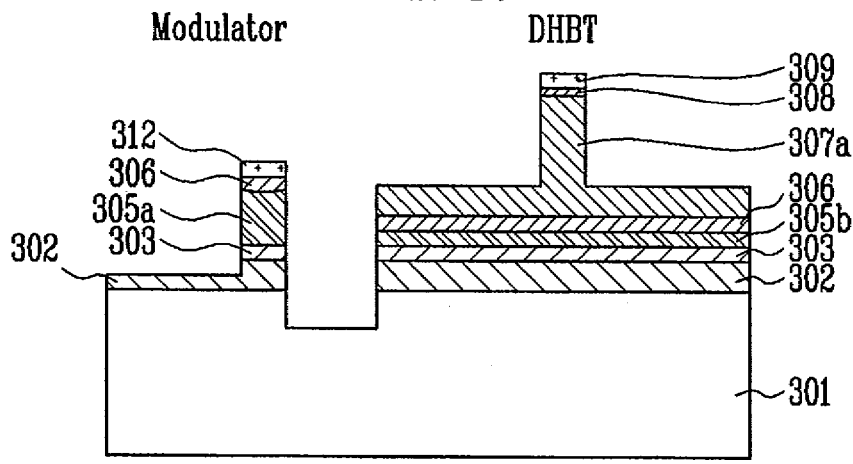
Figure 4D:
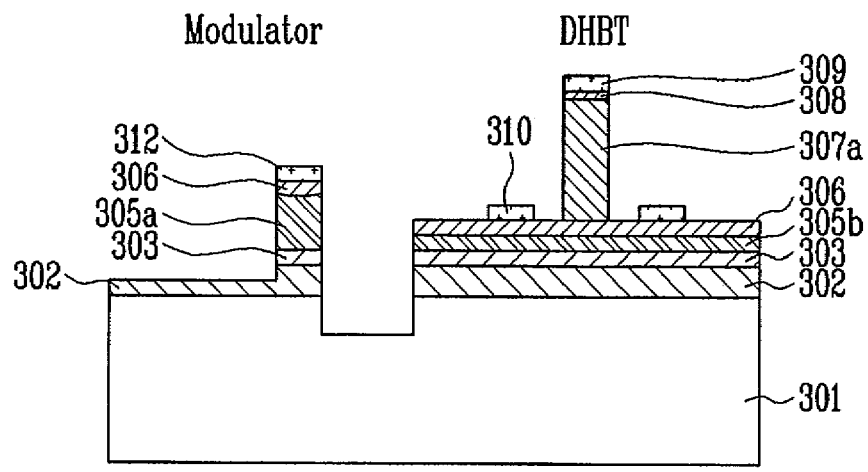

Subsequently, as shown in FIG. 4D, the p$^+$In0.53Ga0.47As base layer 306 is exposed using a photolithography process and a lift-off process, and a Ti/Pt/Au layer is deposited, thereby forming base electrodes 310.

Figure 4E:
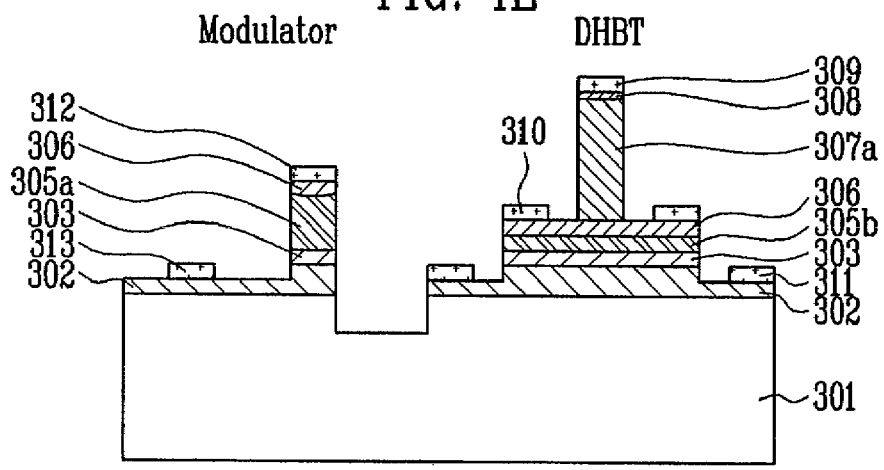

After that, as shown in FIG. 4E, the MQW InGaAs/InP insertion layer of quantum well structure, which is inserted between the base layer 306 and the collector layer 303 and allows the smooth flow of current between the base layer 306 and the collector layer 303, and the n-InP collector layer 303 are selectively etched, and collector electrode pads are formed on a n$^+$InP sub-collector layer 302 using a lift-off process. A Ti/Pt/Au layer is deposited on the collector electrode pads, thereby forming collector electrodes 311. Thus, the DHBT is completed.

Thereafter, the EA modulator is fabricated. To begin, as shown in FIGS. 4B and 4C, the n$^+$In0.53Ga0.47As ohmic layer 308 and the n-InP layer 307, which cover the region for the EA modulator, are removed using an etching process. Then, by using the insulating layer as an etch mask, the p$^+$InGaAs base layer 306, the MQW InGaAs—InP quantum well absorption layer 305a, the n-InP layer 303, and the n$^+$InP sub-collector layer 302 are etched using photolithography and etching processes, so that the crystalline structure of the EA modulator has a waveguide shape. Thereafter, a region for an electrode is prepared using photolithography and lift-off processes, and a Ti/Pt/Au layer is deposited, thereby forming a p-electrode 312.

As shown in FIG. 4E, a photolithography process for a lift-off process is performed, and a Ti/Pt/Au layer is deposited, thereby forming an n-electrode 313. After that, a thermal anneal process is carried out so that the EA modulator is completed.

Figure 4F:
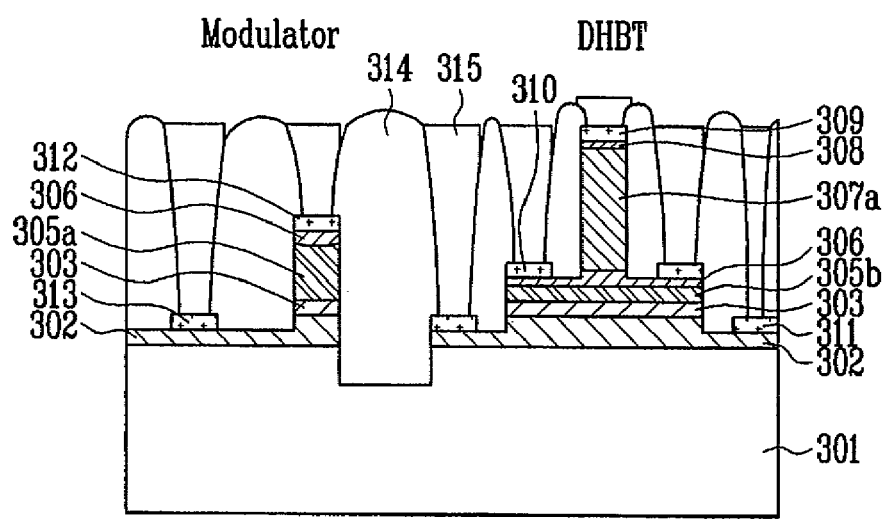

Finally, as shown in FIG. 4F, a polymer 314 is formed to protect the surfaces of the waveguide type EA modulator and DHBT and electrically connect the modulator and the DHBT, and an airbridge metal line (not shown) is formed using a lithography process between the n-electrode 313 of the EA modulator and the output terminal of the collector electrode 311 of the DHBT. Thereafter, a gold-plated layer 315 is formed on the respective electrodes 309, 310, 311, 312, and 313. As a result, a single-chip OE transmitter integrated circuit in which the waveguide type EA modulator and the DHBT formed of n-InP/p$^+$InGaAs/MQW InP—InGaAs/n-InP are integrated is embodied.

In conclusion, according to the present invention, the OE transmitter integrated circuit in which the waveguide type EA modulator is integrated on a single chip can be fabricated using a selective MOCVD process. In the OE transmitter IC, the absorption layer of the waveguide type EA modulator is formed to a greater thickness than that of the quantum well insertion layer of the DHBT, which improves the efficiency of collector current, on the same wafer plane. That is, the waveguide type EA modulator, which has high quantum and modulation efficiency and a high speed characteristic, and the DHBT, which is formed of n-InP/p$^+$InGaAs/MQW InP-InGaAs/n-InP and has an excellent amplification characteristic, can be integrated on the same semi-insulating InP substrate. As a result, since the EA modulator has the high modulation efficiency and the DHBT has a stable driving characteristic caused by a high breakdown voltage, it is possible to fabricate the OE transmitter integrated circuit with both excellent modulation efficiency and stability.

As explained thus far, according to the present invention, an EA modulator with a relatively thick quantum well absorption layer and a DHBT with a relatively thin quantum well insertion layer are integrated on a single substrate, so that an OE transmitter integrated circuit with high modulation efficiency and a stable driving characteristic can be fabricated. Also, optical fibers can be easily aligned to the EA modulator with thicker absorption layer. Further, even though the waveguide type EA modulator and the DHBT are integrated as a single chip using a one-time selective growth process, they are independently optimized in their performances. Therefore, the OE transmitter integrated circuit can be fabricated using a simple process as compared with conventional single-chip fabrication that requires several growth processes.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. An optoelectronic transmitter integrated circuit comprising:
   a semi-insulating substrate;
   an electroabsorption (EA) modulator disposed in a first region on the semi-insulating substrate and having a first sub-collector layer, a first clad layer, a multi-quantum well (MQW) absorption layer, and a second clad layer; and
   a double heterojunction bipolar transistor (DHBT) disposed in a second region adjacent to the first region on the semi-insulating substrate and having a second sub-collector layer, a collector layer, an MQW insertion layer, a base layer, an emitter layer, and an ohmic layer, wherein the MQW insertion has a smaller thickness than that of the MQW absorption layer,
   wherein the MQW insertion layer comprises an InGaAs MQW insertion layer, and
   wherein the EA modulator and the DHBT are integrated as a single chip using a one time selective metal organic chemical vapor deposition (MOCVD) growth process for independently optimizing the EA modulator to have a high modulation efficiency and the DHBT to have a stable driving characteristic caused by a high voltage breakdown.

2. The optoelectronic transmitter integrated circuit according to claim 1,
   wherein the EA modulator further includes:
   a first electrode disposed on a predetermined region of the second clad layer; and a second electrode disposed on a predetermined region of the first sub-collector layer.

3. The optoelectronic transmitter integrated circuit according to claim 1, wherein the DHBT further includes: an emitter electrode disposed on a predetermined region of the ohmic layer and having a mesa structure;

a base electrode disposed on a predetermined region of the base layer; and a collector electrode disposed on a predetermined region of the second sub-collector layer.

* * * * *